(12) United States Patent
Duca et al.

(10) Patent No.: US 12,148,628 B2
(45) Date of Patent: Nov. 19, 2024

(54) SEMICONDUCTOR DEVICE AND CORRESPONDING METHOD

(71) Applicants: STMicroelectronics S.r.l., Agrate Brianza (IT); STMicroelectronics (MALTA) Ltd, Kirkop (MT)

(72) Inventors: Roseanne Duca, Ghaxaq (MT); Dario Paci, Vittuone (IT); Pierpaolo Recanatini, Ornago (IT)

(73) Assignees: STMicroelectronics S.r.l., Agrate Brianza (IT); STMicroelectronics (MALTA) Ltd, Kirkop (MT)

( * ) Notice: Subject to any disclaimer, the term of this patent is extended or adjusted under 35 U.S.C. 154(b) by 200 days.

(21) Appl. No.: 17/942,843

(22) Filed: Sep. 12, 2022

(65) Prior Publication Data

US 2023/0005755 A1 Jan. 5, 2023

Related U.S. Application Data

(62) Division of application No. 17/108,471, filed on Dec. 1, 2020, now Pat. No. 11,443,958.

(30) Foreign Application Priority Data

Dec. 2, 2019 (IT) .................. 102019000022656

(51) Int. Cl.
  *H01L 21/324* (2006.01)
  *H01L 23/16* (2006.01)
  *H01L 23/31* (2006.01)
(52) U.S. Cl.
  CPC ............ *H01L 21/324* (2013.01); *H01L 23/16* (2013.01); *H01L 23/3107* (2013.01)

(58) Field of Classification Search
  CPC ..... H01L 21/565; H01L 21/324; H01L 21/56; H01L 23/16; H01L 23/3107; H01L 24/48; H01L 24/45; H01L 24/49
  See application file for complete search history.

(56) References Cited

U.S. PATENT DOCUMENTS

| | | | |
|---|---|---|---|
| 5,045,918 A | 9/1991 | Cagan et al. | |
| 5,278,446 A * | 1/1994 | Nagaraj | H01L 24/32 |
| | | | 257/667 |

(Continued)

FOREIGN PATENT DOCUMENTS

| | | |
|---|---|---|
| DE | 10300594 A1 | 7/2004 |
| JP | S58028860 A | 2/1983 |

(Continued)

OTHER PUBLICATIONS

IT Search Report and Written Opinion for priority application, IT 102019000022656 dated May 14, 2020 (9 pages).

*Primary Examiner* — Jaehwan Oh
*Assistant Examiner* — John M Parker
(74) *Attorney, Agent, or Firm* — Crowe & Dunlevy LLC

(57) ABSTRACT

A leadframe includes a die pad and a set of electrically conductive leads. A semiconductor die, having a front surface and a back surface opposed to the front surface, is arranged on the die pad with the front surface facing away from the die pad. The semiconductor die is electrically coupled to the electrically conductive leads. A package molding material is molded over the semiconductor die arranged on the die pad. A stress absorbing material contained within a cavity delimited by a peripheral wall on the front surface of the semiconductor die is positioned intermediate at least one selected portion of the front surface of the semiconductor die and the package molding material.

13 Claims, 1 Drawing Sheet

(56) References Cited

U.S. PATENT DOCUMENTS

| | | | |
|---|---|---|---|
| 7,187,075 B1 | 3/2007 | Hwa et al. | |
| 2017/0292884 A1 | 10/2017 | Ching, Jr. et al. | |
| 2020/0111769 A1 | 4/2020 | Fukunaka et al. | |

FOREIGN PATENT DOCUMENTS

| | | | |
|---|---|---|---|
| JP | S59022349 A | 2/1984 | |
| JP | S610102758 A | 5/1986 | |

* cited by examiner

SEMICONDUCTOR DEVICE AND CORRESPONDING METHOD

CROSS REFERENCE TO RELATED APPLICATION

This application is a divisional of U.S. application for patent Ser. No. 17/108,471, filed Dec. 1, 2020, which claims the priority benefit of Italian Application for Patent No. 102019000022656, filed on Dec. 2, 2019, the contents of which are hereby incorporated by reference in their entireties to the maximum extent allowable by law.

TECHNICAL FIELD

The description relates to manufacturing semiconductor devices.

One or more embodiments may be applied to manufacturing integrated circuits (ICs) comprising piezoresistive elements, regions or components.

BACKGROUND

Different types of integrated circuits may comprise elements, regions or components with piezoresistive properties. For instance, many integrated devices may comprise doped diffusion region(s) in (monocrystalline) silicon, such as resistors, transistors or Hall sensors.

These may be sensitive to mechanical stress, that is, they may be subject to an unwanted drift of their performance due to piezoresistive effect as a result of a mechanical stress being applied thereto.

Such a negative effect may be particularly relevant in the case of sensors based on Hall effect (also referred to as "Hall sensors" in the present description), in so far as it may result in a (significant) shift of the sensor sensitivity.

Also, such a negative effect may be particularly relevant in the case of circuits for generating high precision voltage references.

There is a need in the art to contribute in providing packaged semiconductor devices, such as Hall sensors, with improved performance immunity against mechanical stress.

SUMMARY

One or more embodiments may facilitate reducing transmission of mechanical stress from the molded package to the regions of the semiconductor die which are sensitive to piezoresistive effect (e.g., a piezoresistor located at the surface of a silicon die molded in the IC package).

One or more embodiments may relate to a semiconductor device (e.g., an integrated circuit).

One or more embodiments may relate to a corresponding method of manufacturing semiconductor devices.

One or more embodiments may provide a packaged semiconductor device comprising: a leadframe comprising a die pad and a set of electrically conductive leads, at least one semiconductor die having a front surface and a back surface opposed to the front surface, the at least one semiconductor die being arranged on the die pad with said front surface facing away from the die pad, the at least one semiconductor die being electrically coupled to said electrically conductive leads, package molding material molded over the semiconductor die arranged on the die pad, and stress absorbing material intermediate at least one selected portion of said front surface of the at least one semiconductor die and the package molding material.

In one or more embodiments, a containment structure may be provided at the front surface of the at least one semiconductor die. The containment structure may comprise peripheral walls configured to define a closed perimeter, and the stress absorbing material may be contained within the closed perimeter.

BRIEF DESCRIPTION OF THE DRAWINGS

One or more embodiments will now be described, by way of example only, with reference to the annexed figures, wherein.

DETAILED DESCRIPTION

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

Throughout the figures annexed herein, like parts or elements are indicated with like references/numerals and a corresponding description will not be repeated for brevity.

The references used herein are provided merely for convenience and hence do not define the extent of protection or the scope of the embodiments.

Figure 1:
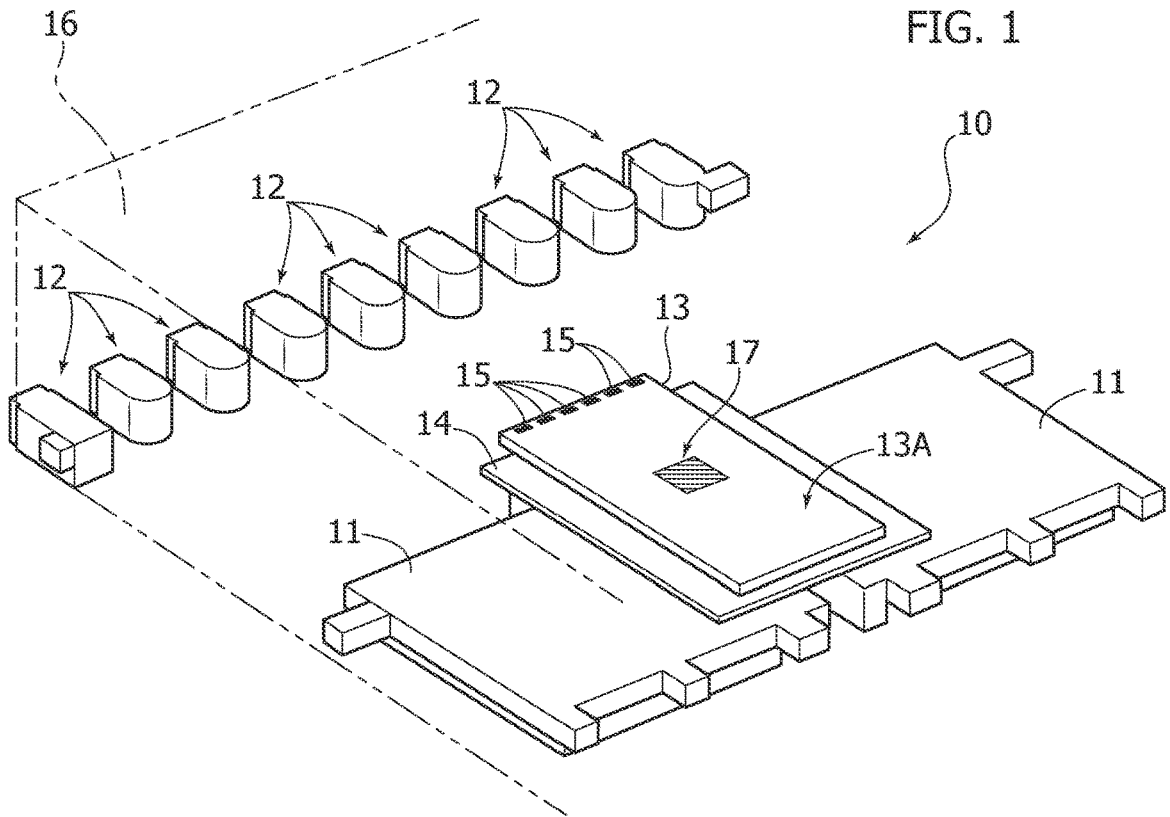
FIG. 1 is a perspective view exemplary of certain elements of a portion of a semiconductor device.

By way of introduction to the detailed description of exemplary embodiments, reference may be first had to FIG. 1, which is a perspective view exemplary of certain elements of a portion of a semiconductor device 10.

As conventional in the art, together with other elements/features not visible in FIG. 1, a semiconductor device 10 as exemplified herein may comprise:
  a leadframe comprising a die pad 11 and a set of electrically conductive leads 12, and
  a semiconductor die 13 mounted on the die pad 11.

Optionally, the semiconductor device 10 may comprise a glass die 14 interposed between the semiconductor die 13 and the die pad 11 of the leadframe. The glass die 14 may provide galvanic isolation (e.g., up to several kV) between the die pad 11 of the leadframe and the semiconductor die 13 (e.g., a sensor die).

For instance, galvanic isolation may be involved in current sensors where the exposed pads are used to drive a current in package to be sensed from Hall sensors in a sensor die. The current line, in this case, may be galvanically isolated.

The semiconductor die 13 may be provided with electrically conductive bonding pads 15 configured for electrical coupling to the leads 12 by means of bonding wires (not visible in FIG. 1). Such bonding pads 15 may be provided on a front (e.g., top) surface 13A of the semiconductor die 13, i.e., on the surface facing away from the die pad 11. As conventional in the art, the bonding pads 15 may be provided at the periphery of said front surface 13A.

Additionally, the semiconductor device 10 may comprise package molding material 16 (e.g., epoxy molding material) encapsulating the semiconductor die 13 and the leadframe. At least a portion of the leads 12 is exposed outside of the package molding material 16 (e.g., at a rear or bottom side thereof) to allow electrical coupling of the semiconductor device 10, e.g., to a printed circuit board (PCB).

In one or more embodiments, the semiconductor die 13 may comprise at least one element or region 17 which is sensitive to piezoelectric effect (e.g., at least one piezo-resistor and/or a Hall sensor). For instance, such element or region 17 may be located near or at the front surface 13A.

Therefore, mechanical stresses (e.g., normal and/or shear stresses, mainly lateral but also out of plane) applied to the semiconductor device 10 (e.g., applied to the package 16) may affect the device performance. For instance, in case the element or region 17 comprises a sensing device such as a Hall sensor, an applied mechanical stress may result in an unwanted drift of the device output.

Mechanical stresses applied to the package 16 are one major source of stresses which may influence the performance of the device (e.g., the drift of a sensor). The contact region(s) between the molding compound of the package 16 and the front surface 13A, where piezo-sensitive components 17 may be located (e.g., implanted), may act as a transmission point of mechanical stress from the package to the sensitive region(s).

Where the molding compound is a relatively rigid and viscoelastic polymer, the influence on the performance of the device may turn out to be relevant especially under certain harsh conditions.

Figure 2:
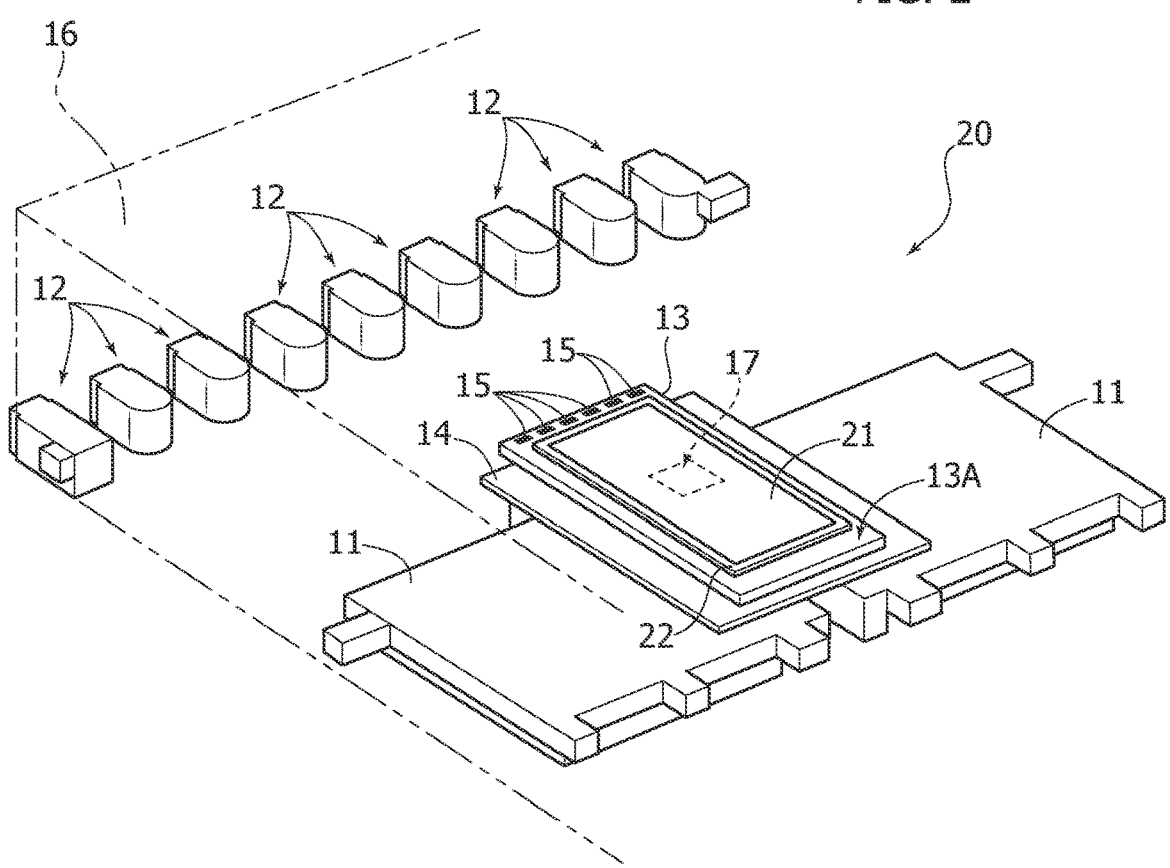
FIG. 2 is a perspective view exemplary of certain elements of a portion of a semiconductor device.

Therefore, in one or more embodiments, a semiconductor device 20 as exemplified in FIG. 2 may comprise a layer of stress absorbing material 21 interposed between the semiconductor die 13 (in particular, the top surface 13a) and the package molding material 16. The stress absorbing material 21 may be a deformable material or a "stress-relief" material. Such a layer of stress absorbing material may act as a (mechanical) stress buffer layer.

In one or more embodiments, such a layer of stress absorbing material 21 may be provided by resorting to a "dam-and-fill" approach, that is, by:
  providing a "dam-like" containment structure 22 on the front surface 13A of the semiconductor die 13 that delimits (peripherally surrounds) a cavity region, and
  filling the cavity region with the stress absorbing material 21, wherein a volume of the included stress absorbing material 21 is defined by the size and shape of the containment structure 22 and the front surface 13A.

The containment structure 22 may comprise a set of peripheral "walls" configured to provide a closed perimeter for the cavity region suitable to be filled by the stress absorbing material 21, which may be dispensed (e.g., poured) therein. The containment structure 22 and the front surface 13A may thus define a sort of molding cavity for molding of the stress absorbing material 21.

The peripheral walls of the containment structure 22 may be approximately 100 μm high. In one or more embodiments, such walls may be higher than 100 μm.

The closed perimeter of the containment structure 22 may have an approximately rectangular or squared shape. However, any closed shape may be used in alternative embodiments.

The containment structure 22 may be designed so to enclose the area 17 of the semiconductor device 13 which is sensitive to the piezoresistive effect (e.g., a piezo-resistor) within the closed perimeter. Thus, the stress absorbing material 21 will effectively cover over the area 17.

The containment structure 22 may be designed so to leave the bonding pads 15 on the front surface 13A of the semiconductor die 13 outside of (i.e., external to) the closed perimeter, thereby allowing a conventional wire bonding manufacturing step, even after dispensing of the stress absorbing material 21 over the semiconductor die 13.

Such a "dam-and-fill" approach may solve the concern of having the stress absorbing material 21 possibly flowing on the wire bonding pads 15, thereby resulting in some of the bonding wires being immersed in the stress absorbing material. In fact, this might result in some wires that are partially immersed in the stress absorbing material and partially encapsulated within a molding compound. During thermal cycling, this may result in relevant thermo-mechanical stresses due to mismatches of the coefficients of thermal expansion, possibly causing failures of the bonding wire(s).

In one or more embodiments, a plurality of containment structures 22 filled with stress absorbing material 21 may be provided on a same semiconductor die 13, e.g., in order to cover a plurality of distinct regions 17 sensitive to piezoresistive effect.

The containment structure 22 may comprise resin material, e.g., epoxy resin material. The mechanical characteristics of the resin material of the containment structure 22 may be similar to those of the package molding material 16.

The stress absorbing material 21 may comprise a silicone material and/or other types of soft gel materials. In one or more embodiments, the stress absorbing material 21 may have a low elastic modulus, e.g., lower than 2 MPa, preferably lower than 1 MPa.

The stress absorbing material 21 may have a high coefficient of thermal expansion, e.g., about 300 ppm/° C.

In one or more embodiments, after filling of the containment structure 22 with the stress absorbing material 21, an otherwise conventional package material 16 may be molded over the leadframe and the semiconductor die 13 (which is at least partially covered by the stress absorbing material 21).

In one or more embodiments, providing a layer (or volume) of stress absorbing material 21 interposed between (selected portions of) a semiconductor die 13 and the package molding material 16 may be compatible with a design for performance approach.

One or more embodiments may thus facilitate reducing transmission of mechanical stress from the package 16 to (selected portions of) the semiconductor die 13, thereby reducing the drift of the device performance (e.g., the drift of the output of a sensor) due to mechanical stress. For instance, a reduction of more than 40% of the performance drift may be sought.

As exemplified herein, a semiconductor device (e.g., 20) may comprise:
  a leadframe (e.g., 11, 12) comprising a die pad (e.g., 11) and a set of electrically conductive leads (e.g., 12),
  at least one semiconductor die (e.g., 13) having a front surface (e.g., 13A) and a back surface opposed to the front surface, the at least one semiconductor die being arranged on the die pad with the front surface facing away from the die pad, the at least one semiconductor die being electrically coupled to the electrically conductive leads, package molding material (e.g., 16) molded over the semiconductor die arranged on the die pad, and stress absorbing material (e.g., a layer of material 21) intermediate at least one selected portion (e.g., 17) of said front surface of the at least one semiconductor die and the package molding material.

As exemplified herein, a semiconductor device may comprise at least one containment structure (e.g., 22) at the front surface of the at least one semiconductor die, the at least one containment structure comprising peripheral walls configured to define a closed perimeter, wherein the stress absorbing material is contained within said closed perimeter.

As exemplified herein, the at least one containment structure may comprise a resin material.

As exemplified herein, a height of the at least one containment structure (e.g., a height of the peripheral walls of the containment structure) may be equal to or higher than 100 μm.

As exemplified herein, the stress absorbing material may comprise silicone material and/or soft gel material.

As exemplified herein, the stress absorbing material may have an elastic modulus lower than 2 MPa, preferably lower than 1 MPa.

As exemplified herein, the at least one semiconductor die may comprise electrically conductive bonding pads (e.g., 15) located at said front surface, the electrically conductive bonding pads being electrically coupled to said electrically conductive leads, wherein the electrically conductive bonding pads are located outside said at least one selected portion of the front surface of the at least one semiconductor die.

As exemplified herein, the at least one semiconductor die may comprise at least one region sensitive to piezoresistive effect located within the at least one selected portion of the front surface of the at least one semiconductor die.

As exemplified herein, the at least one semiconductor die may comprise a sensor device located within the at least one selected portion of the front surface of the at least one semiconductor die, preferably a Hall sensor device.

As exemplified herein, a method of manufacturing semiconductor devices may comprise:

providing a leadframe comprising a die pad and a set of electrically conductive leads, providing at least one semiconductor die having a front surface and a back surface opposed to the front surface, and arranging the at least one semiconductor die on the die pad with said front surface facing away from the die pad, providing stress absorbing material (e.g., a layer of material) over at least one selected portion of said front surface of the at least one semiconductor die, electrically coupling the at least one semiconductor die to said electrically conductive leads, and molding package molding material over the semiconductor die arranged on the die pad.

Without prejudice to the underlying principles, the details and embodiments may vary, even significantly, with respect to what has been described by way of example only, without departing from the extent of protection.

The claims are an integral part of the technical teaching provided herein in respect of the embodiments.

The extent of protection is defined by the annexed claims.

The invention claimed is:

1. A method of manufacturing, comprising:

mounting a semiconductor die to a die pad of a leadframe which also includes a set of electrically conductive leads, wherein the semiconductor die has a first surface facing away from the die pad and a second surface opposed to the first surface mounted to the die pad;

forming a containment structure at the first surface of the semiconductor die, the containment structure comprising a peripheral wall configured to define a closed perimeter surrounding a cavity over a selected portion of said first surface of the semiconductor die;

filling the cavity with a stress absorbing material;

electrically coupling the semiconductor die to said electrically conductive leads; and depositing material for encapsulating the semiconductor die, the containment structure and the stress absorbing material.

2. The method of claim 1, wherein the depositing comprises molding said material to encapsulate the leadframe.

3. The method of claim 1, wherein said containment structure comprises a resin material.

4. The method of claim 1, wherein a height of said containment structure is equal to or higher than 100 μm.

5. The method of claim 1, wherein said stress absorbing material comprises a material selected from a group consisting of a silicone material and a soft gel material.

6. The method of claim 1, wherein the stress absorbing material has an elastic modulus lower than 2 MPa.

7. The method of claim 1, wherein the stress absorbing material has an elastic modulus lower than 1 MPa.

8. The method of claim 1, wherein forming the containment structure comprises placing the peripheral wall in a position where the peripheral wall is located between the cavity and the electrically conductive bonding pads at said first surface of the semiconductor die.

9. The method of claim 1, wherein said selected portion of said first surface of the semiconductor die is associated with a portion of the semiconductor die which is sensitive to a piezoresistive effect.

10. The method of claim 9, wherein said portion of the semiconductor die which is sensitive to a piezoresistive effect comprises a Hall sensor.

11. The method of claim 1, wherein said selected portion of said first surface of the semiconductor die is associated with a portion of the semiconductor die which is sensitive to a mechanical stress.

12. The method of claim 1, further comprising galvanically isolating the second surface of the semiconductor die from the die pad.

13. The method of claim 12, wherein galvanically isolation comprises installing a glass die interposed between the second surface of the semiconductor die and the die pad.

* * * * *